(12) United States Patent
Roig-Guitart et al.

(10) Patent No.: US 11,152,497 B2
(45) Date of Patent: Oct. 19, 2021

(54) VARIABLE RESISTANCE TO REDUCE GATE VOTLAGE OSCILLATIONS IN GALLIUM NITRIDE TRANSISTORS

(71) Applicant: SEMICONDUCTOR COMPONENTS INDUSTRIES, LLC, Phoenix, AZ (US)

(72) Inventors: Jaume Roig-Guitart, Oudenaarde (BE); Aurore Constant, Oudenaarde (BE); Frederick Johan G Declercq, Harelbeke (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 45 days.

(21) Appl. No.: 16/169,550

(22) Filed: Oct. 24, 2018

(65) Prior Publication Data
US 2020/0135907 A1 Apr. 30, 2020

(51) Int. Cl.
| | |
|---|---|
| *H01L 29/22* | (2006.01) |
| *H01L 29/778* | (2006.01) |
| *H01L 29/20* | (2006.01) |
| *H01L 29/40* | (2006.01) |
| *H01L 29/47* | (2006.01) |
| *H01L 29/423* | (2006.01) |
| *H01L 29/66* | (2006.01) |

(52) U.S. Cl.
CPC ...... *H01L 29/7783* (2013.01); *H01L 29/2003* (2013.01); *H01L 29/404* (2013.01); *H01L 29/42324* (2013.01); *H01L 29/42364* (2013.01); *H01L 29/475* (2013.01); *H01L 29/66462* (2013.01); *H01L 29/7787* (2013.01)

(58) Field of Classification Search
CPC combination set(s) only.
See application file for complete search history.

(56) References Cited

U.S. PATENT DOCUMENTS

| | | | | |
|---|---|---|---|---|
| 2011/0304360 | A1* | 12/2011 | Nakamura | H02M 1/083 327/104 |
| 2014/0028375 | A1* | 1/2014 | Komiya | H02M 3/158 327/427 |
| 2014/0244945 | A1* | 8/2014 | Kim | G11C 13/004 711/147 |

(Continued)

OTHER PUBLICATIONS

GaN Systems Inc., "GN001 Application Brief, How to Drive GaN Enhancement Mode HEMT," Mar. 24, 2016.

(Continued)

*Primary Examiner* — Moin M Rahman
(74) *Attorney, Agent, or Firm* — Brake Hughes Bellermann LLP

(57) ABSTRACT

A semiconductor transistor device includes a GaN transistor including a drain, a gate, and a source, the GaN transistor having a driving voltage applied across the gate and the source and configured to switch between an on-voltage associated with an on-state of the GaN transistor and an off-voltage associated with an off-state of the GaN transistor. The semiconductor transistor device further includes a variable gate-source resistor connected between the gate and the source and having a variable resistance that varies in response to changes in the driving voltage when switching between the on-state and the off-state of the GaN transistor.

15 Claims, 17 Drawing Sheets

(56) References Cited

U.S. PATENT DOCUMENTS

2014/0346975 A1* 11/2014 Jeong ............... H01J 1/304
                                                    315/308
2016/0260373 A1*  9/2016 Miyake ............ G09G 3/3233
2018/0145684 A1*  5/2018 Chang ............. H03K 17/102
2019/0348410 A1* 11/2019 Roig-Guitart ...... H01L 23/528

OTHER PUBLICATIONS

Thorsell et al. "Electrothermal Access Resistance Model for GaN-Based HEMTs," IEEE Transactions on Electron Devices, vol. 58, No. 2. Feb. 2011.

Infenion, Deboy et al., "The Value of Emode GaN HEMTs for High Density and High Efficiency Applications," APEC 2018, PSMA Session, Mar. 4-8, 2018.

Efthymiou et al., "Effect of Device Layout on the Switching of Enhancement Mode GaN HEMTs," Proceedings of the 30th International Symposium on Power Semiconductor Devices & ICs, May 13-17, 2018.

* cited by examiner

VARIABLE RESISTANCE TO REDUCE GATE VOTLAGE OSCILLATIONS IN GALLIUM NITRIDE TRANSISTORS

TECHNICAL FIELD

This description relates to the reduction of gate voltage oscillations in Gallium Nitride transistor devices.

BACKGROUND

Gallium Nitride (GaN) transistors provide a number of advantages in constructing integrated circuits. For example, GaN transistors generally have a smaller size for a particular on-resistance and breakdown voltage, as compared to traditional silicon-based transistors. Further, GaN transistors generally provide, as compared to other options for constructing transistors, advantages in implementing high power, high frequency, high voltage, and/or high temperature applications.

SUMMARY

According to one general aspect, a semiconductor transistor device includes a GaN transistor including a drain, a gate, and a source, the GaN transistor having a driving voltage applied across the gate and the source and configured to switch between an on-voltage associated with an on-state of the GaN transistor and an off-voltage associated with an off-state of the GaN transistor. The semiconductor transistor device further includes a variable gate-source resistor connected between the gate and the source and having a variable resistance that varies in response to changes in the driving voltage when switching between the on-state and the off-state of the GaN transistor.

The details of one or more implementations are set forth in the accompanying drawings and the description below. Other features will be apparent from the description and drawings, and from the claims.

DETAILED DESCRIPTION

In some use cases of GaN transistors, it is necessary or desirable to switch the transistors at relatively high speeds. For example, a GaN transistor may be switched from an off-state voltage of 0V to an on-state or driving voltage of 5V, and vice-versa. In the context of such switching operations, problematic frequency oscillations may occur in the gate-source voltage ($V_{GS}$) of the GaN transistor. Such oscillations may lead to various difficulties, such as energy losses from accidental turn-on of the GaN transistor, accelerated device or system degradation or failure, and electro-magnetic compatibility issues with other nearby circuit components.

Although various techniques exist to try to minimize such difficulties, these existing techniques are associated with other challenges and shortcomings. For example, existing approaches may require consumption of undesirably large quantities of surface area on the chip of the GaN transistor, or may be associated with reduced switching speeds of the GaN transistor, or with power losses.

The transistor devices described herein can include a variable resistor connected between a gate and a source of a GaN transistor, which provides switching stability for switching operations of the GaN transistor. The gate-source variable resistor can be constructed and configured such that its resistance varies in a manner that reduces or eliminates the effects of unwanted, relatively high-frequency gate-source voltage oscillations (also referred to as gate 'ringing' or driving voltage ($V_{DR}$) oscillations).

Such driving voltage oscillations generally occur during switching transitions, when the GaN transistor switches from on to off, or from off to on. For example, when switching from a driving voltage of 5V to 0V, or from 0V to 5V, the driving voltage may oscillate prior to settling at the new, desired value. Such oscillations may cause the GaN transistor to operate in an undesired region, such as being turned on instead of being turned off, or vice-versa.

As explained in detail below, a resistance value of the described gate-source variable resistor can be configured to vary in response to changes (in magnitude and/or frequency) of a driving voltage of the GaN transistor. Consequently, the resistance value of the gate-source variable resistor reduces and effectively provides a short circuit when the GaN transistor turns off, which, e.g., prevents the GaN from experiencing unwanted turn-on. Further, the gate-source variable resistor may provide a low-pass filter when the GaN is turning on, thereby preventing unwanted effects from the relatively high-frequency driving voltage oscillations, such as, e.g., unwanted turn-off.

Figure 1:
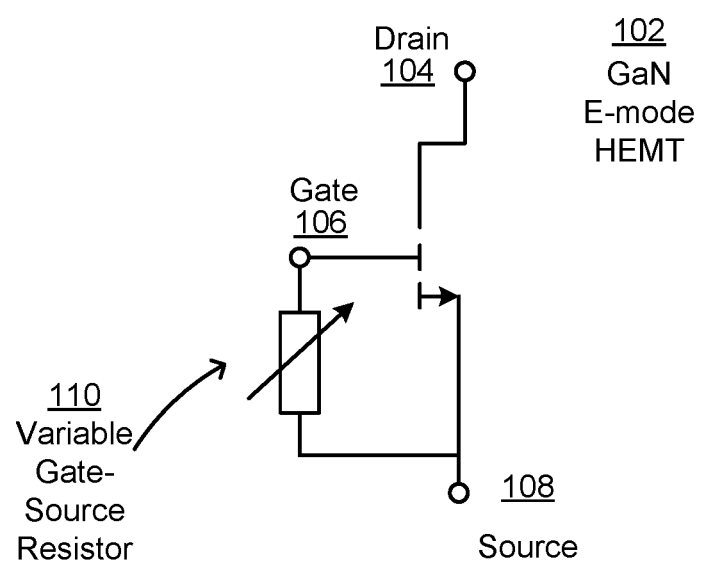
FIG. 1 is a circuit diagram of a GaN transistor with a variable gate-source resistor for enhancing switching stability.

FIG. 1 is a circuit diagram of a gallium nitride (GaN) enhancement mode (E-mode) high electron mobility transistor (HEMT), referred to herein as GaN transistor 102. The GaN transistor 102 is illustrated as having a drain 104, gate 106, source 108, and as having a variable gate-source resistor 110 for enhancing switching stability of the GaN transistor 102. The GaN transistor 102 should be understood to represent and include various types of transistors, such as various types of GaN transistors. For example, the GaN transistor 102 may also represent a depletion mode (D-mode) transistor.

In the example of FIG. 1, the variable gate-source resistor 110 is connected between the gate 106 and the source 108. As also referenced above, and described in detail below, the variable gate-source resistor 110 is configured to vary in resistance value, in response to a driving voltage $V_{DR}$ that is applied at the gate 106 in conjunction with driving switching operations of the GaN transistor 102.

As a result of such variations in resistance of the variable gate-source resistor 110, switching operations of the GaN transistor 102 are, for example, stable, reliable, and fast. Moreover, undesired results, such as energy blockage or periods of dead time, or overshoot/undershoot operations, are avoided.

Figure 2:
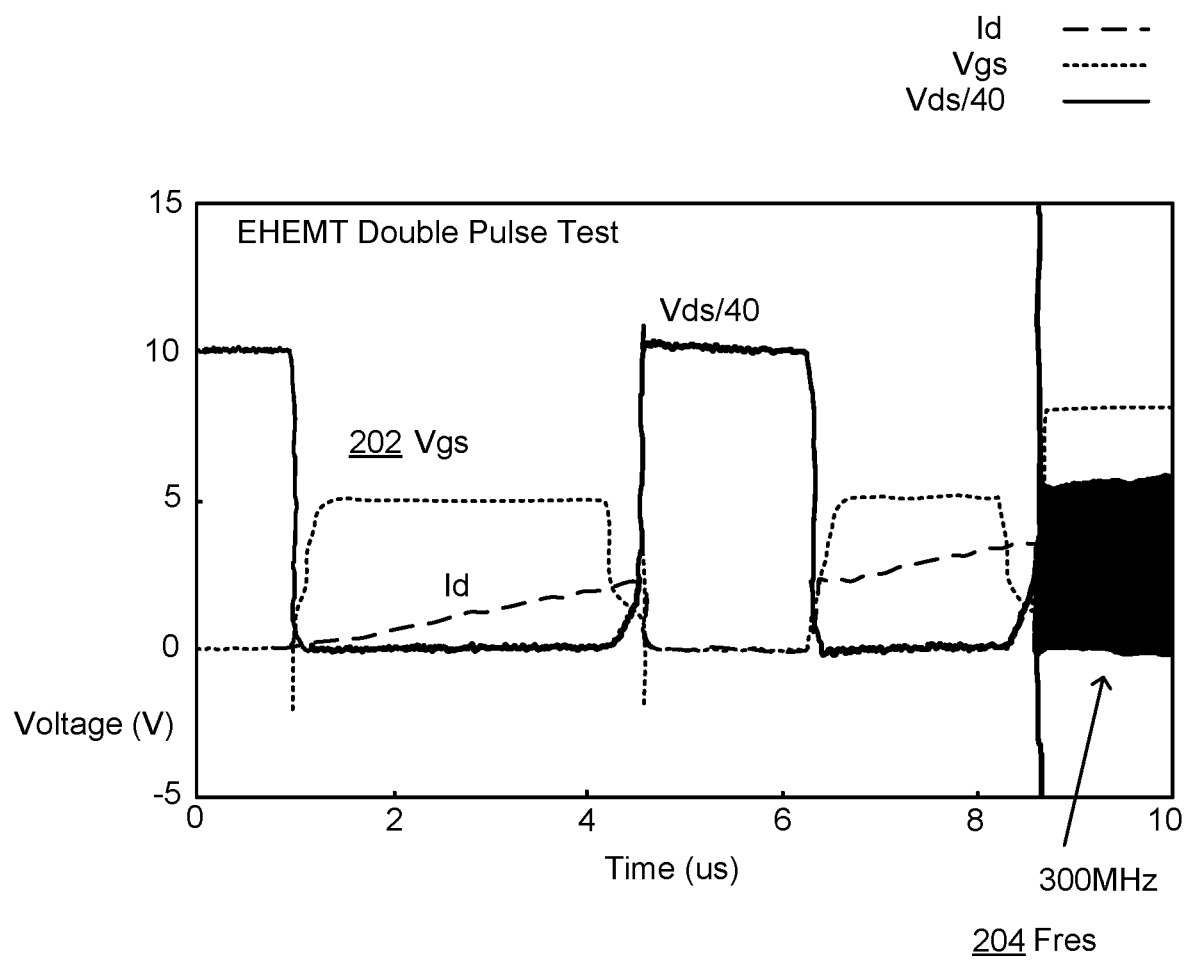
FIG. 2 is a timing diagram illustrating example voltages applied to the GaN transistor of FIG. 1.

FIG. 2 is a timing diagram illustrating example voltages applied to the GaN transistor 102 of FIG. 1. In the example of FIG. 2, a driving voltage is illustrated as a gate-source voltage $V_{GS}$ 202, which may be repeatedly switched from a high value corresponding to an on stage of the GaN transistor 102, to a low value corresponding to an off stage of the GaN transistor 102. A corresponding switching frequency ($F_{SW}$) or driving frequency of the GaN transistor 102 may thus be selected to have any desired, appropriate value. For example, switching or driving frequencies may occur in a range of, e.g., 100 kHz to 1 MHz.

When switching from an on stage at a high driving voltage to an off stage at a low driving voltage, or, conversely, from an off stage to an on stage, the driving voltage 202 may exhibit unwanted oscillations. For example, as shown, the driving voltage 202 may experience oscillations having a frequency $F_{RES}$ 204, representing a transient resonance frequency. As shown, the resonance frequency $F_{RES}$ 204 may have a magnitude comparable to a magnitude of the driving voltage 202, and a frequency that is orders of magnitude higher than the switching frequency. For example, values of $F_{RES}$ 204 may occur in the range of tens or hundreds of megahertz (MHz).

FIG. 2 illustrates an example in which the operations at the resonance frequency $F_{RES}$ 204 occur in response to a turn off behavior of the driving voltage 202. As just referenced, such oscillations may also occur in response to a transition from an off state to an on state of the GaN transistor 102.

Figure 3:
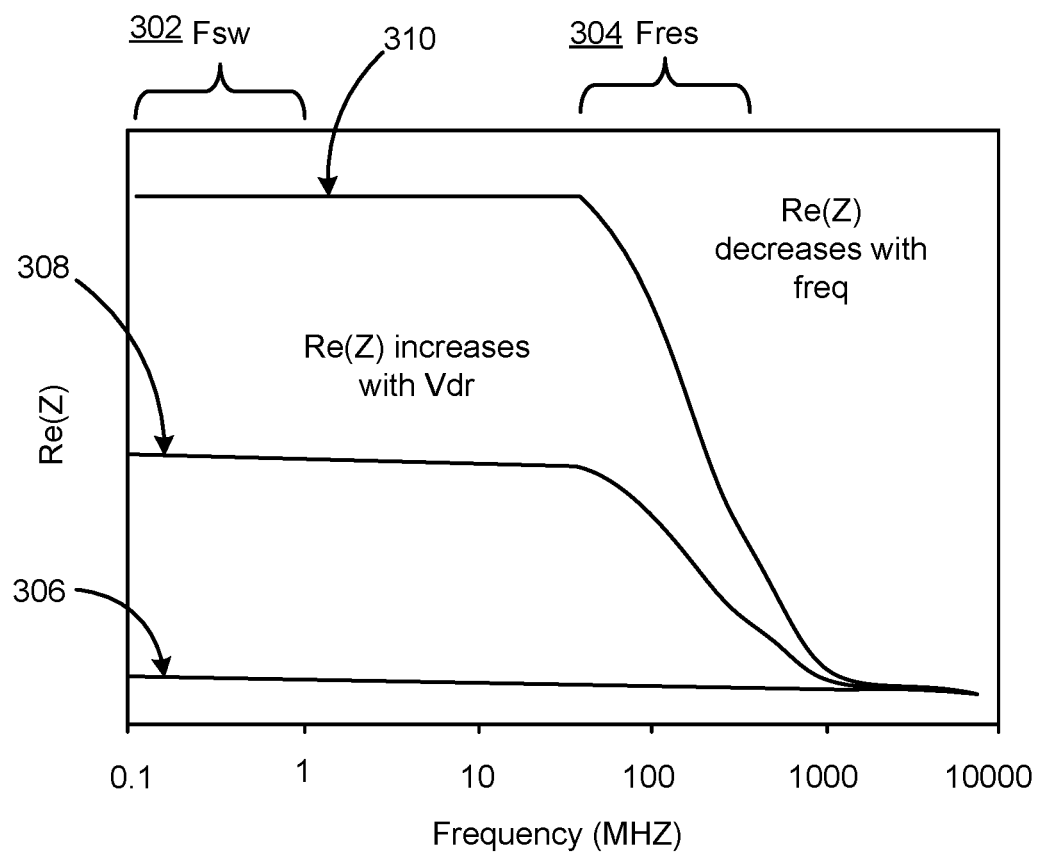
FIG. 3 is a diagram illustrating voltage and frequency response characteristics of a resistance value of the variable source-gate resistor of FIG. 1.

FIG. 3 is a diagram illustrating voltage and frequency response characteristics of a resistance value of the variable source-gate resistor 110 of FIG. 1. As is shown in the example of FIG. 2, the diagram of FIG. 3 illustrates a switching frequency $F_{SW}$ range 302, as well as a frequency range of a resonance frequency $F_{RES}$ 304. FIG. 3 further illustrates three example curves 306, 308, 310, corresponding to different example values of driving voltages.

As illustrated in the example of FIG. 3, within a frequency range of the switching frequency $F_{SW}$ 302, a resistance value of the gate-source resistor 110 increases in direct dependence with increasing values of driving voltage $V_{DR}$. That is, for example, within the frequency range of the switching frequency $F_{SW}$ 302, the resistance value rises when $V_{DR}$ rises, and falls when $V_{DR}$ falls.

Meanwhile, within a range of frequencies corresponding to a resonance frequency $S_{RES}$ 304 of the unwanted voltage oscillations that may occur with respect to the driving voltage $V_{DR}$, a resistance value of the variable gate-source resistor 110 decreases rapidly and substantially with increasing frequency, even when the driving voltage $V_{DR}$ is high. In other words, the variable gate-source resistor 110 acts as a low pass filter in the referenced, resonance frequency range. Put another way, as shown and described in detail, below, within a range of frequencies corresponding to a resonance frequency $F_{RES}$ 304, the resistance value of the gate-source resistor 110 is reduced with increases in the frequency $F_{RES}$ 304, while continuing to be reduced for decreases in the driving voltage $V_{DR}$, as also occurs within the switching frequency range $F_{SW}$.

Thus, a reduction of the driving voltage $V_{DR}$ results in a corresponding reduction of a resistance value of the variable gate-source resistor 110. Consequently, when the driving voltage switches from a high value to a low value, the variable gate-source resistor 110 effectively functions as a short circuit between the gate 106 and the source 108. This short circuit has an effect of pulling down any overshoot of the driving voltage, thereby preventing unwanted turn on of the GaN transistor 102. As a result, for example, energy losses are reduced (e.g., minimized) in the scenarios, and switching operations of the GaN transistor 102 are stabilized.

During turn on scenarios, when the driving voltage goes from a low to a high value, FIG. 3 illustrates that a resistance value of the variable gate-source resistor 110 will be high within frequency ranges of the switching frequency $F_{SW}$ 302, but will be low in frequency ranges associated with the resonance frequency $F_{RES}$ 304 of the unwanted gate voltage oscillations. Consequently, for example, a desired drain current $I_D$ may be obtained while the GaN transistor 102 is switched on.

Figure 4:
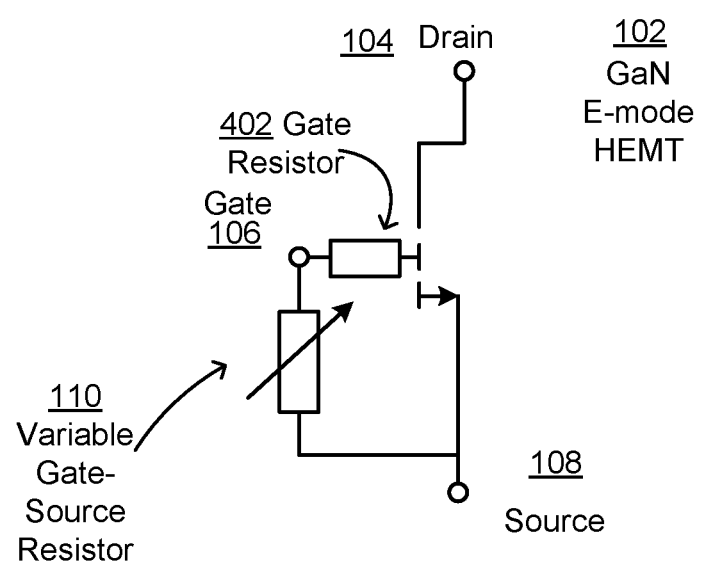
FIG. 4 is a circuit diagram illustrating an alternate example implementation of the circuit of FIG. 1.

FIG. 4 is a circuit diagram illustrating an alternate example implementation of the circuit of FIG. 1. In FIG. 4, a gate resistor 402 is illustrated as being connected at the gate 106.

In the example of FIG. 4, the gate resistor 402 is a resistor with a uniform, non-varying resistance value. The gate resistor 402 provides additional advantages during switching operations of the GaN transistor 102. For example, during an off state, low-voltage context, and transitions thereto from an on state, high-voltage context, the gate resistor 402 enhances and facilitates operation of the variable gate-source resistor 110 as having an effective short circuit between the gate 106 and the source 108. In contrast, during on state, high voltage context, and transitions thereto from an off state, low voltage context, the gate resistor 402 provides additional input impedance at the gate 106.

In the following description and figures, the variable gate-source resistor 110, and variations thereof, may be referred to as R1 (and variations thereof). Similarly, the gate resistor 402, and variations thereof, may be referred to as R2 (and variations thereof).

Figure 5:
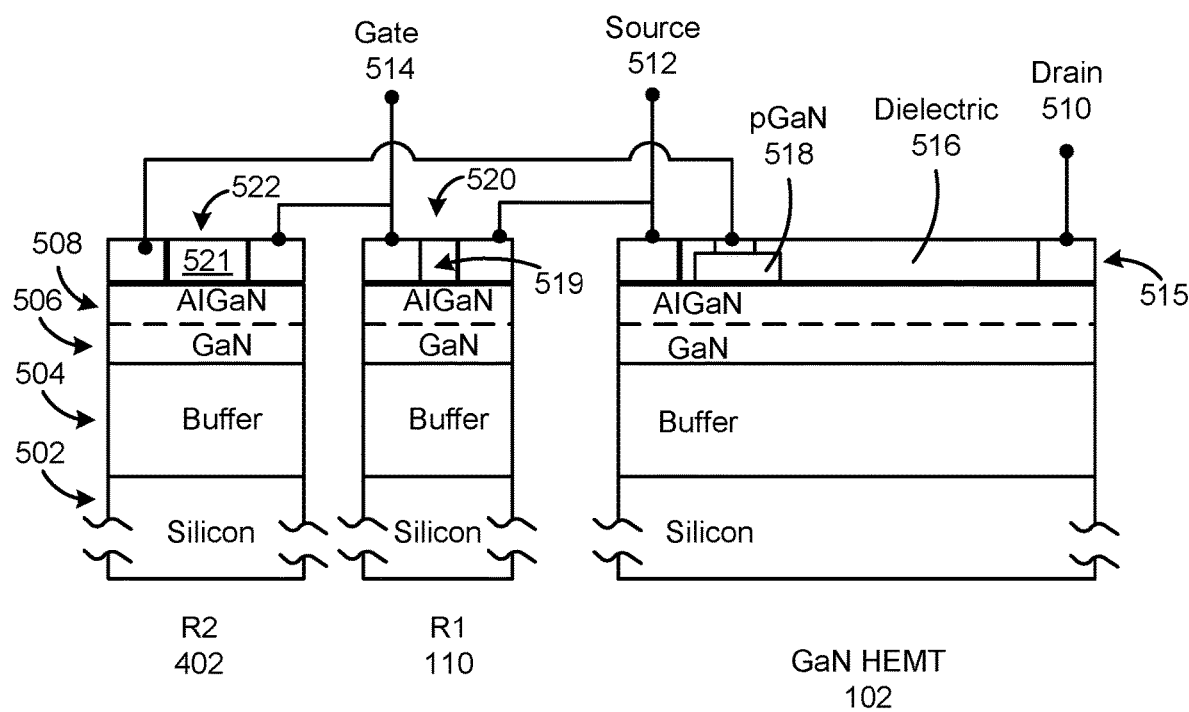
FIG. 5 is a diagram illustrating an example construction of the circuit of FIG. 4.

FIG. 5 is a diagram illustrating an example construction of the circuit of FIG. 4. In the example of FIG. 5, the GaN transistor 102 and the resistors 110, 402 are illustrated as being constructed on a silicon substrate 502. The silicon layer 502 includes a buffer layer 504, a channel layer 506 of gallium nitride, and a barrier layer 508 of aluminum gallium nitride. The barrier layer 508 can include $Al_xIn_yGa_{(1-x-y)}N$, wherein $0<x\le 1$ and $0\le y\le 0.5$. The substrate 502 can include silicon, sapphire (monocrystalline $Al_2O_3$), silicon carbide (SiC), aluminum nitride (AlN), gallium oxide ($Ga_2O_3$), spinel ($MgAl_2O_4$), another suitable substantially monocrystalline material, or the like. The buffer layer 504 can be formed over the substrate 502 to help with supporting a high voltage and to provide a template for the channel layer 506. The buffer layer 504 can have a thickness in a range from approximately 1 micron to 10 microns.

As further illustrated, a drain 510, a source 512, and a gate 514 may thus be defined with respect to corresponding electrical contacts 515 on the layer 508 of aluminum gallium nitride. In the GaN transistor 102, dielectric layer 516 insulates the corresponding drain and source contacts 515 from an acceptor-doped gate or gate cap 518, pGaN. The dielectric layer 516 can include an oxide, nitride, or an oxynitride, and may be formed over the barrier layer 508. In an embodiment, the dielectric layer 516 can include silicon nitride and have a thickness in a range from 0 nm to 2000 nm.

In FIG. 5, the variable gate-source resistor 110 is illustrated as including a resistive dielectric region 519 with a length defined by an electrode spacing 520, while the gate resistor 402 is illustrated as including a resistive dielectric region 521 with a length defined by an electrode spacing 522. As shown in FIG. 5, and as discussed and described in detail below, the variable gate-source resistor 110 has an electrode spacing 520 that is significantly shorter in length, as compared to the electrode spacing 522 of the gate resistor 402. In operation, and for a given width W, the shorter length of the electrode spacing 520 results in current saturation in response to increases in an applied driving voltage. This current saturation leads to the above-described increases in a resistance value of the variable gate-source resistor 110 in response to increased driving voltages. Moreover, the increase in the resistance value may occur within a timeframe corresponding to a timeframe of increases in the driving voltage.

Further, as also described below, by controlling a length $L_{ds}$ of the electrode spacing 520, it is possible to control a manner and extent to which a resistance value of the variable gate-source resistor 110 varies in correspondence with applied driving voltages. In particular, it is possible to relate a resistance value range at which a resistance value of the variable gate-source resistor 110 is reduced (e.g., minimized), and at which the resistance value is maximized, to a corresponding range of a driving voltage in particular implementations of the GaN transistor 102. For example, if the GaN transistor 102 has a driving voltage that is varied between 0 volts in an off state and 5 volts in an on state, a length of the electrode spacing 520 may be selected so that the resistance value of the variable gate-source resistor 110 is minimized at 0 volts, and maximized at 5 volts. More generally, the resistance value of the variable gate-source resister 110 may be configured to vary between a range of resistance values that provide the results, and corresponding advantageous effects, described herein.

Thus, the electrode spacing 520 may be constructed to have a length $L_{ds}$ shorter than a threshold length required to cause a resistance value of the variable gate-source resistor 110 to vary directly with a driving voltage of the GaN transistor 102 within the switching frequency range $F_{SW}$. Further, appropriate selection of the length $L_{ds}$ also leads to the resistance value of the variable gate-source resistor 110 being reduced in response to increases in the driving frequency of the driving voltage to be within a range of the resonance frequency $F_{RES}$ 304, while continuing to be reduced in response to reductions of the magnitude of the driving voltage.

Figure 6:
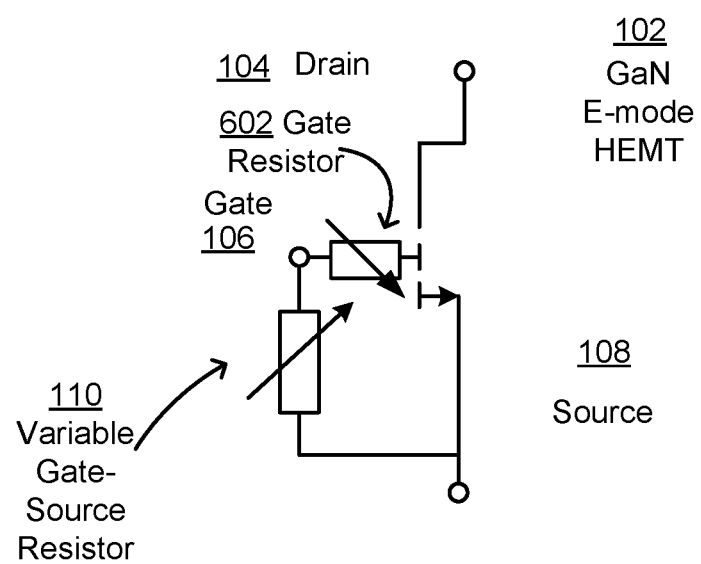
FIG. 6 is a circuit diagram of an alternate example implementation of the circuit of FIG. 1.

FIG. 6 is a circuit diagram of an alternate example implementation of the circuit of FIG. 1. In the example of FIG. 6, a variable gate resistor 602 is illustrated as being connected at the gate 106. As described below with respect to FIGS. 7 and 8, the variable gate resistor 602 may be configured to accentuate and enhance the advantageous effects of the fixed gate resistor 402 of FIGS. 4 and 5.

Figure 7:
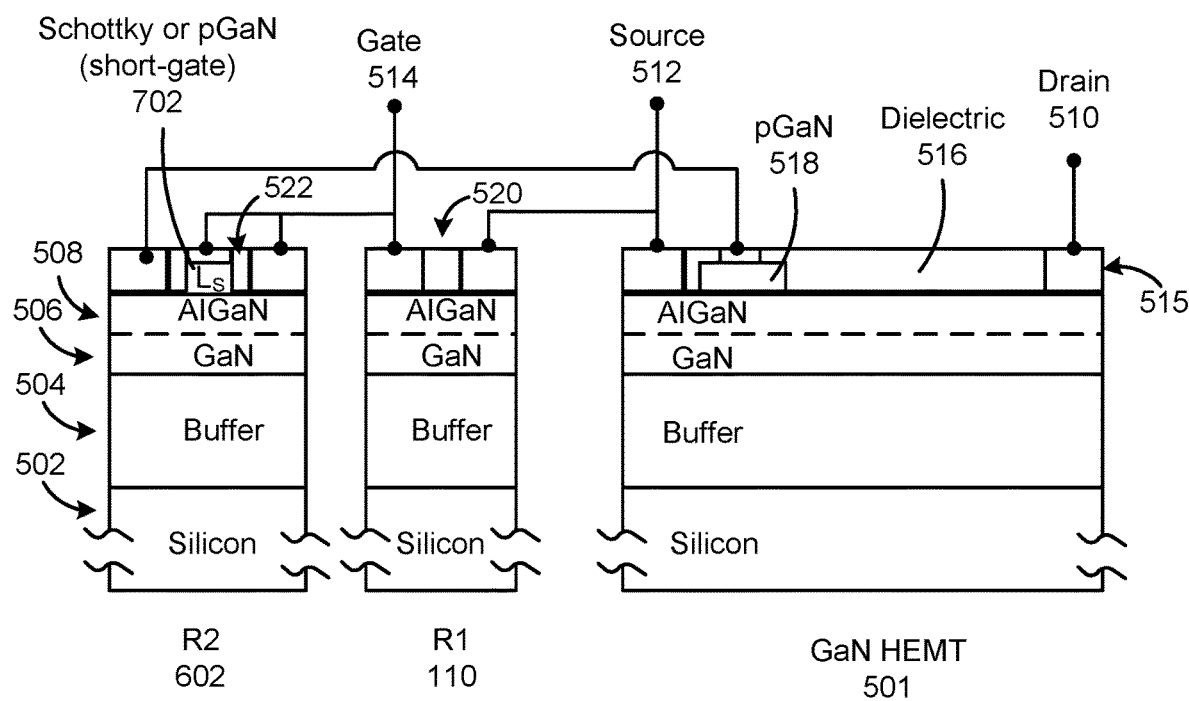
FIG. 7 is a diagram illustrating an example construction of the circuit of FIG. 6.

In particular, FIG. 7 is a diagram illustrating an example construction of the circuit of FIG. 6. In FIG. 7, the variable gate resistor 602 is illustrated a Schottky or pGaN contact within the electrode spacing 522. The Schottky contact 702 may also be referred to as a short gate contact, because it is constructed as a same or similar material as the gate contact 518, but with a shorter length Ls.

Figure 8:
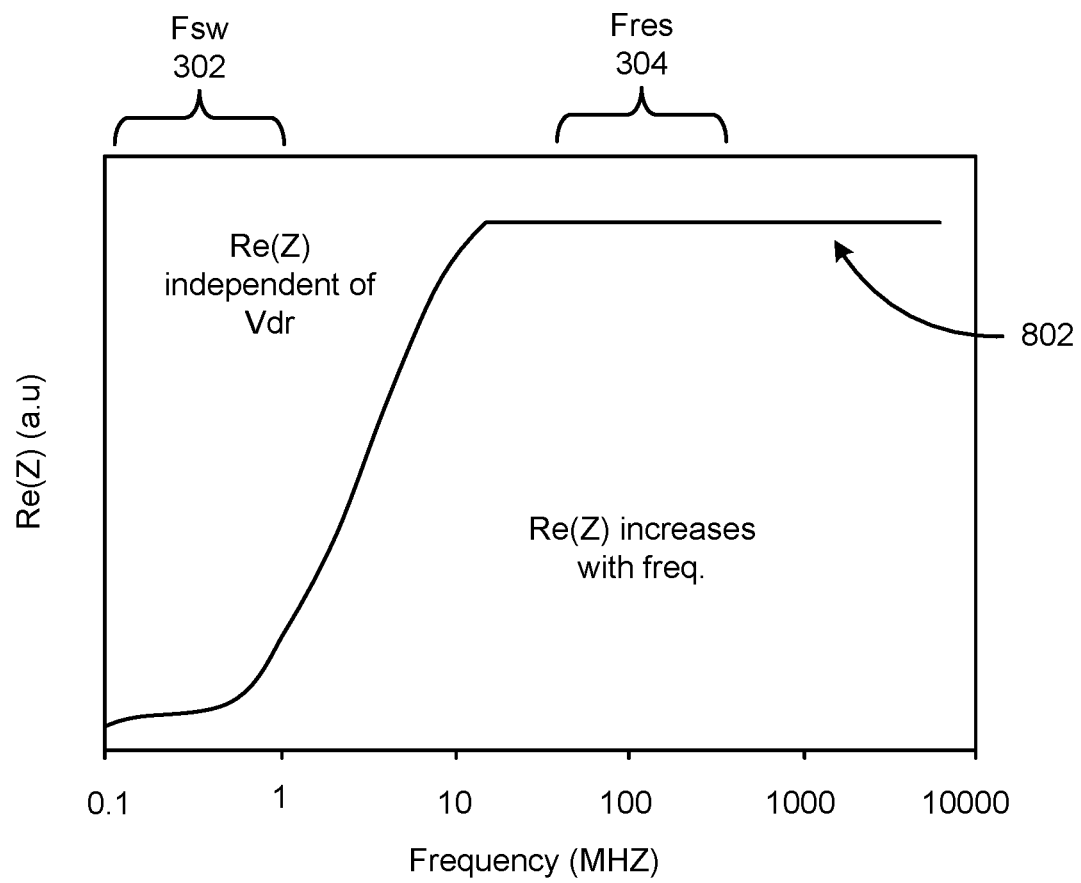
FIG. 8 is a diagram illustrating a frequency response of a resistance value of the variable gate resistor of FIG. 6.

FIG. 8 is a diagram illustrating a frequency response of a resistance value of the variable gate resistor 602, as constructed in FIG. 7. As shown in FIG. 8, and in contrast with the similar type of diagram illustrated in FIG. 3, the resistance value as a function of frequency Re(Z) of the variable gate resistor 602 is independent of a magnitude of the driving voltage $V_{DR}$, but increases with increasing frequencies of the driving voltage $V_{DR}$. This effect is illustrated by an example curve 802, which shows that the resistance value Re(Z) is low within a frequency range of the switching frequency $F_{SW}$ 302, but high within a frequency range of the resonance frequency $F_{RES}$ 304 of the unwanted gate voltage oscillations. Consequently, the variable gate resistor 602 provides an enhanced version of the effects of the gate resistor 402.

Figure 9:
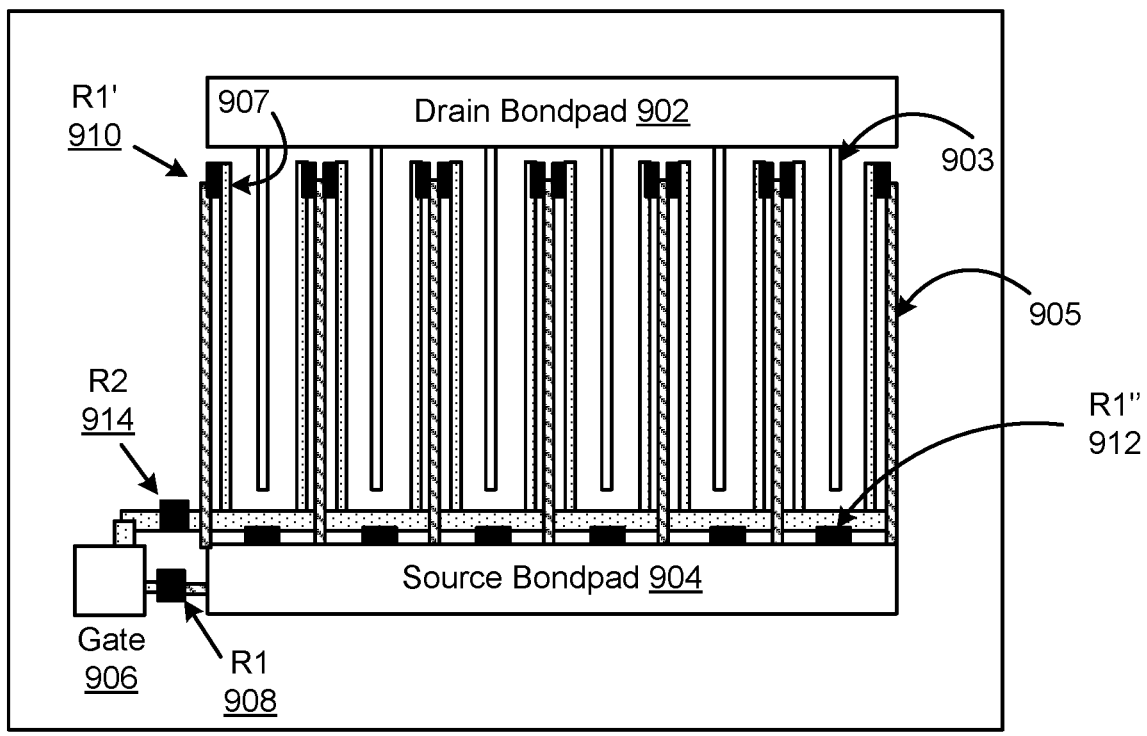
FIG. 9 is a diagram illustrating an example layout for implementing variations of the circuits of FIGS. 1, 4, and 6.

FIG. 9 is a diagram illustrating an example layout for implementing variations of the circuits of FIGS. 1, 4, and 6. In particular, the GaN transistor 102 may typically be implemented in the context of a plurality of GaN transistors on a common substrate, which are operated in conjunction with one another to obtain a desired switching effect. In order to conserve space on a surface of the common substrate, various techniques exist for constructing the plurality of GaN transistors in efficient and cost-effective manners.

For example, in FIG. 9, a drain bondpad 902 is illustrated in conjunction with a source bondpad 904. As shown, the drain bondpad 902 is electrically connected to a plurality of drain fingers 903, while the source bondpad 904 is electrically connected to a plurality of source fingers 905. Similarly, a gate 906 is connected to a plurality of gate fingers 907. Accordingly, the layout of FIG. 9 illustrates that a plurality of GaN transistors may be implemented between the various fingers 903, 905, 907, while providing common points of contact by way of the bondpads 902, 904 and the gate contact 906.

In the context of FIG. 9, the variable gate-source resistor 110 may thus be connected in one or more of a variety of manners. For example, the variable gate-source resistor 110 may be implemented as resistor R1 908 that is connected between the gate contact 906 and the source bondpad 904. Additionally, or alternatively, the variable gate-source resistor 110 may be connected between the gate fingers 907 and corresponding source fingers 905, as illustrated by resistor R1' 910. In an additional example implementation of the variable gate-source resistor 110, a resistor R1" 912 may be placed between the source bondpad 904 and individual pairs of the gate fingers 907, as shown.

In general, the various example implementations of the resistors 908, 910, 912 illustrate a trade-off between consumption of surface area of the common substrate and desired switching characteristics of the various GaN transistors of FIG. 9. For example, by positioning the resistor 908 as shown, it is possible to provide the described frequency response characteristics for the resistor 908 in a manner that applies to all of the various gate fingers 907 and source fingers 905. Further, the resistor 908 consumes very little surface area of the common substrate, as compared to the surface area consumed by the various GaN transistors. On the other hand, the resistor 908 is positioned at a distance that varies with respect to the various fingers 905, 907, so that a corresponding propagation delay may be experienced with respect to the fingers 905, 907 that are most remote from the resistor 908.

Conversely, the resistors 910 are positioned to reduce such concerns with propagation delay, but collectively consume more surface area then the individual resistor 908. Meanwhile, the resistor 912 illustrates an intermediate solution, consuming intermediate amounts of surface space while providing intermediate quantities of propagation delay. Thus, in various implementations, various combinations of one or more of the resistors 908, 910, 912 may be included as a matter of design choice.

Finally with respect to FIG. 9, a resistor R2 914, representing an example implementation of the gate resistors 402, 602 of FIGS. 4 and 6 is illustrated as being commonly connected between the various gate fingers 907 and the gate contact 906. Although not specifically illustrated in the example of FIG. 9, the resistor 914 may also be implemented using a plurality of individual resistances in conjunction with individual ones of the gate fingers 907. Regardless of the configuration of the resistors 908-914, the example implementation of FIG. 9 provides a space-effective and cost-effective manner of efficiently obtaining desired switching characteristics for the various GaN transistors. For example, the layout of FIG. 9 may be implemented with the resistors 908-914 having an area that is at least two orders of magnitude smaller than an overall die area of the underlying gallium nitride (e.g., the layer 506 of FIG. 5).

Figure 10:
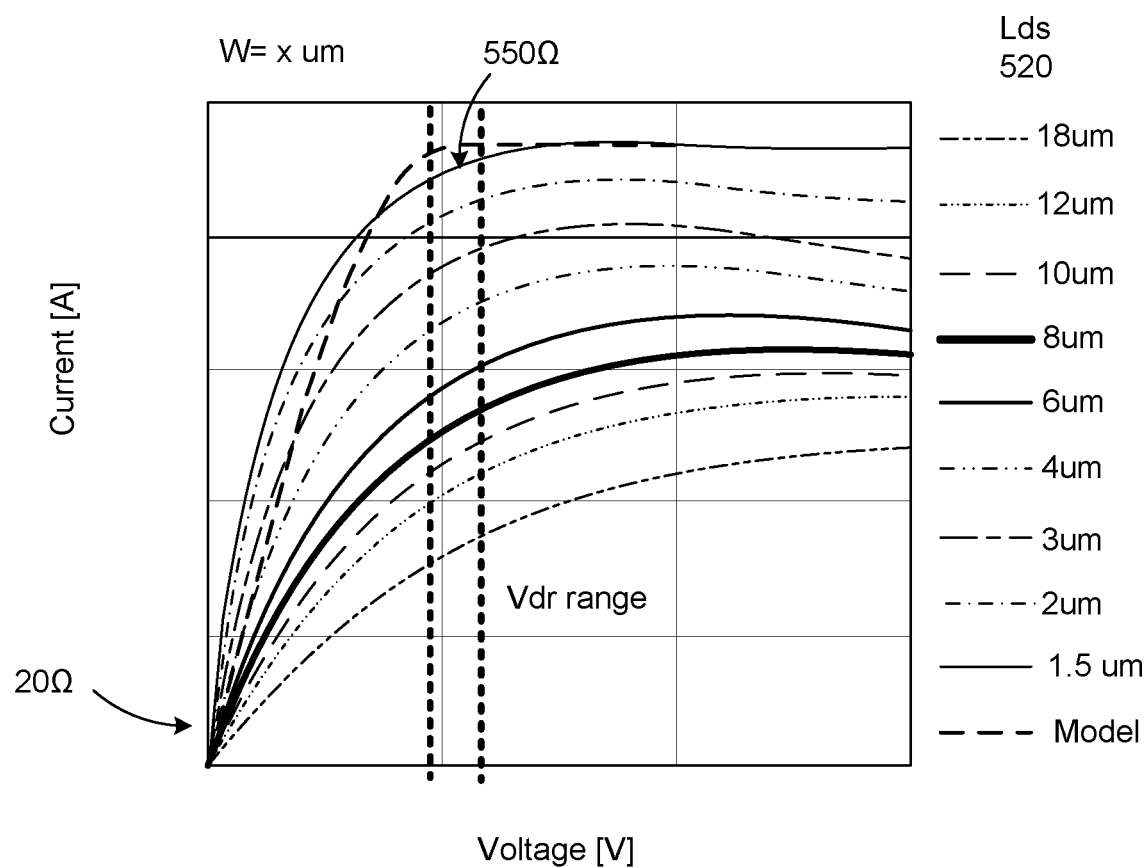
FIG. 10 is a diagram illustrating a current voltage graph for the variable gate-source resistor of FIG. 1.

FIG. 10 is a diagram illustrating a current voltage graph for the variable gate-source resistor 110 of FIG. 1. More particularly, as shown, FIG. 10 assumes a common width W=x microns, and varying lengths $L_{DS}$ of the resistive dielectric layer 519 defined by the electrode spacing 520 of FIG. 5. FIG. 10 illustrates that, within a range of driving voltages ($V_{DR}$ range), the resistance value tends to increase more rapidly for smaller values of $L_{DS}$ than for larger values. In other words, as the resistance is the derivative of the curves illustrated, it may be observed, e.g., by graphing resistance as a function of driving voltage, that the resistance rises much faster at relatively lower voltages for the relatively shorter values of $L_{DS}$. In specific example implementations, the dielectric layer 520 may thus have a length $L_{DS}$ of, e.g., 2.0, 1.5, 1.0 microns or less.

Figure 11:
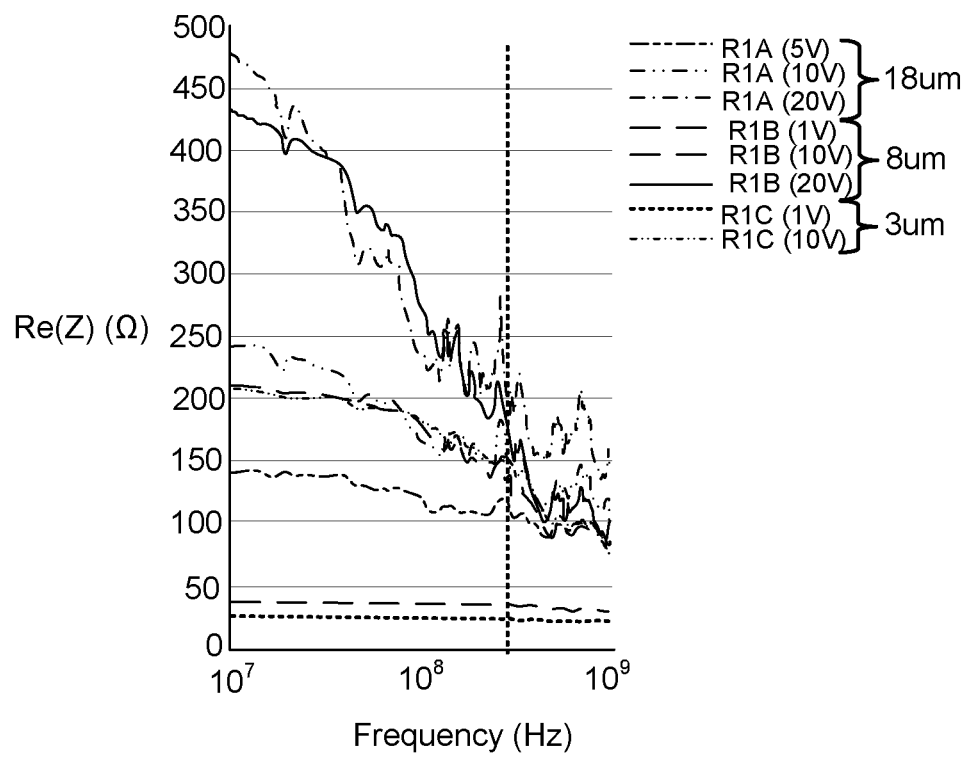
FIG. 11 is a graph illustrating a frequency response of a resistance value of the variable gate-source resistor of FIG. 1 for different applied voltages and different electrode spacings of the variable gate-source resistor.

FIG. 11 is a graph illustrating a frequency response of a resistance value of the variable gate-source resistor 110 for different voltages and different values of $L_{DS}$. As may be observed, the resistance value Re(Z) generally reduces as a function of frequency, in accordance with the graph of FIG. 3. Also in accordance with FIG. 3, FIG. 11 demonstrates that the effect of frequency-dependent reductions in the resistance value are observed for higher values of the driving voltage, while staying, in the example of FIG. 11, lower and constant with respect to frequency when the driving voltage is low.

Figure 12:
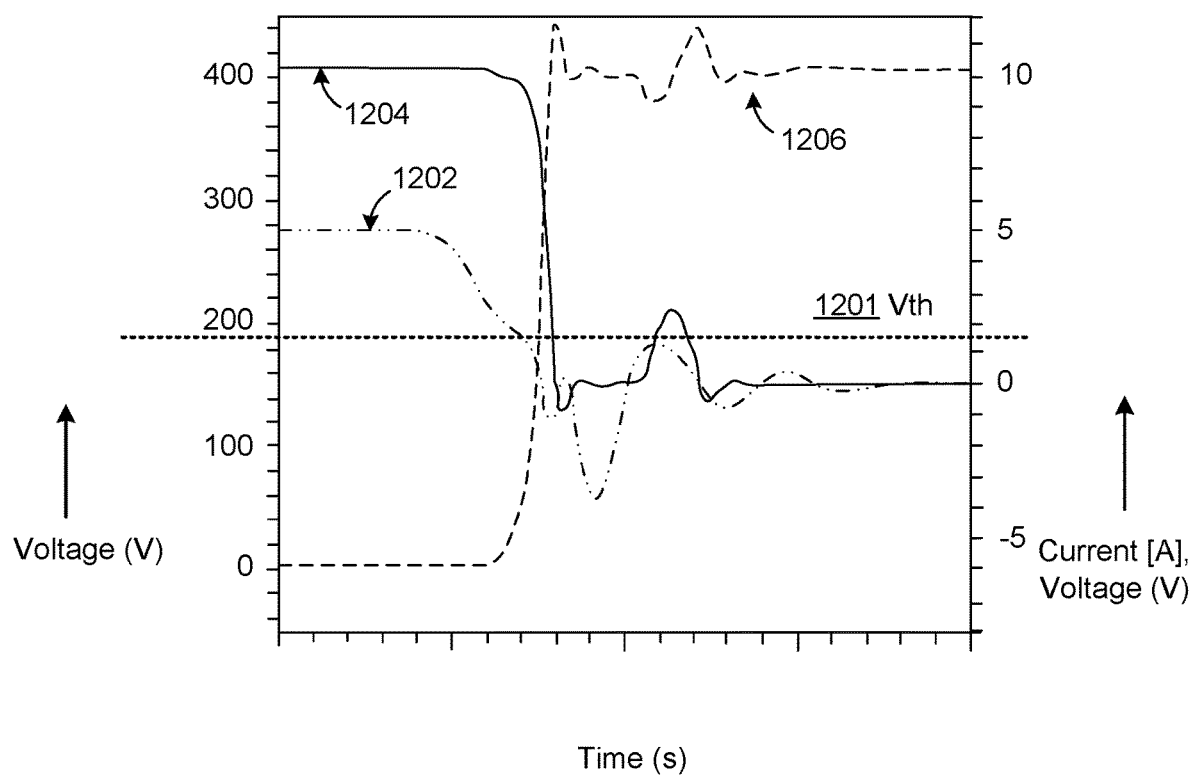
FIG. 12 is a timing diagram illustrating a change in gate source voltage across the GaN transistor of FIG. 1 during a time of a turn off operation.

FIG. 12 is a timing diagram illustrating a change in gate source voltage $V_{GS}$ of the GaN transistor 102 during a time of a turn off operation. In FIG. 12, a voltage curve 1202 represents a gate source voltage $V_{GS}$ or driving voltage $V_{DR}$, of the GaN transistor 102. As shown, in conjunction with a crossing of the driving voltage 1202 across a threshold voltage $V_{TH}$ 1201, the GaN transistor is turned off, so that a drain current 1204 is reduced, while the drain source voltage $V_{DS}$, represented by the curve 1206, increases.

As shown, the gate source voltage $V_{GS}$ 1202 remains below the threshold voltage $V_{TH}$ 1201 following the switching event. Although oscillations in the gate source voltage $V_{GS}$ 1202 may be observed following a crossing of the $V_{GS}$ curve 1202 below the threshold voltage $V_{TH}$ 1201, such oscillations are reduced by virtue of the techniques described herein, including use of the variable gate-source resistor 110. Consequently, as may be observed from FIG. 12, the $V_{GS}$ 1202 voltage does not cause an unintentional (e.g., accidental) turn on of the GaN transistor 102 (e.g., by rising back about $V_{TH}$ 1201 as a result of the unwanted gate voltage oscillations). Consequently, energy losses from the switching operations are reduced, and a stable switching behavior is observed.

Figure 13:
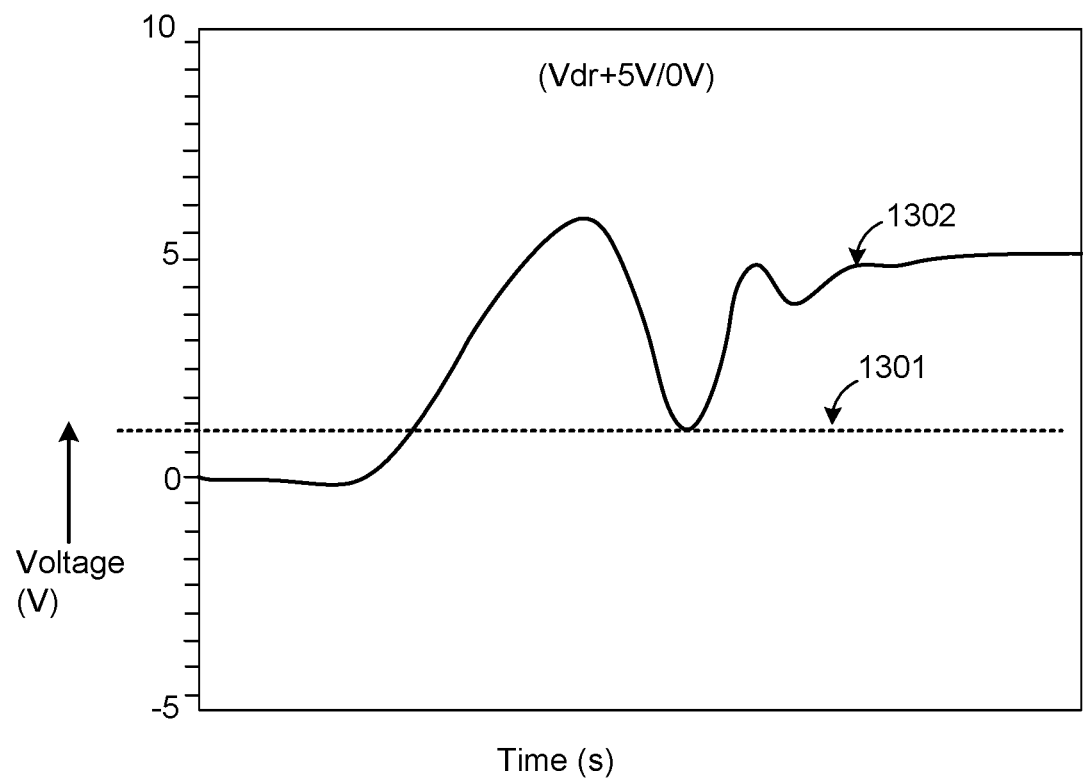
FIG. 13 is a timing diagram illustrating a change in gate source voltage of the GaN transistor of FIG. 1 during a time of a turn on operation.

FIG. 13 is a timing diagram illustrating a change in gate source voltage $V_G$s of the GaN transistor during a time of a turn on operation. As shown in FIG. 13, a threshold voltage 1301 (similar to the threshold voltage 1201 of FIG. 12) is crossed during a turn-on operation. A gate-source voltage $V_{GS}$ 1302 crosses the threshold voltage 1301 and experiences the described oscillations, as shown. However, as also shown, the effects of the various implementations described herein serve to maintain the oscillations above the threshold voltage 1301. As a result, for example, the GaN transistor 102 is not inadvertently and undesirably turned off.

Figure 14A:
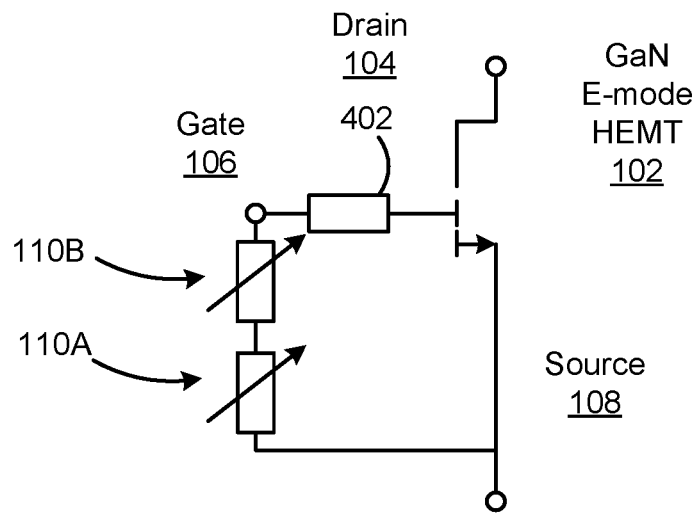
FIG. 14A is a circuit diagram of an alternate implementation of the circuits of FIGS. 1, 4, and 6.
Figure 14B:
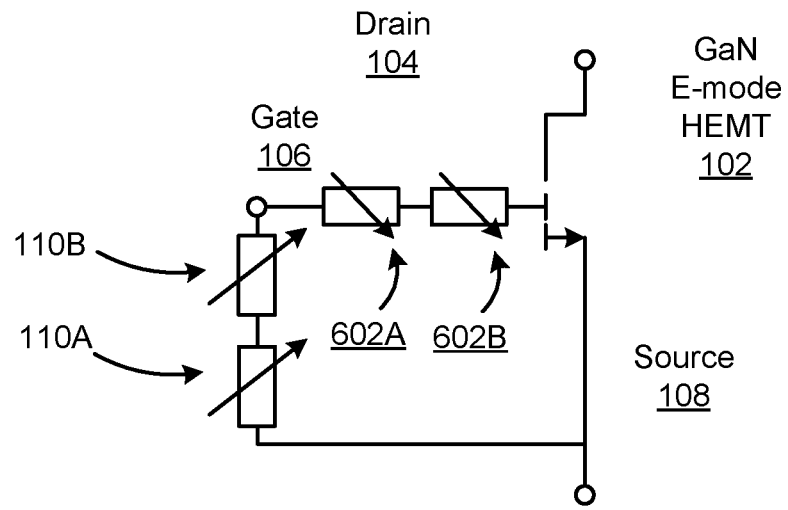
FIG. 14B is a circuit diagram of an alternate implementation of the circuit of FIG. 14A.

FIGS. 14A-17B are circuit diagrams of alternate implementations of the circuits of FIGS. 1, 4, and 6. In FIG. 14A, the variable gate-source resistor 110 is illustrated as being implemented using two variable gate-source resistors 110A, 110B in series. For example, the circuit of FIG. 14A may be configured such that the resistors 110A, 110A have different frequency response characteristics (e.g., different values of $L_{DS}$), to obtain a desired effect. For example, the implementation of FIG. 14A may be used to suppress different ranges of oscillation frequencies. Similarly, in FIG. 14B, variable gate resistors 602A, 602B are connected in series and configured to have different frequency response characteristics.

Figure 15:
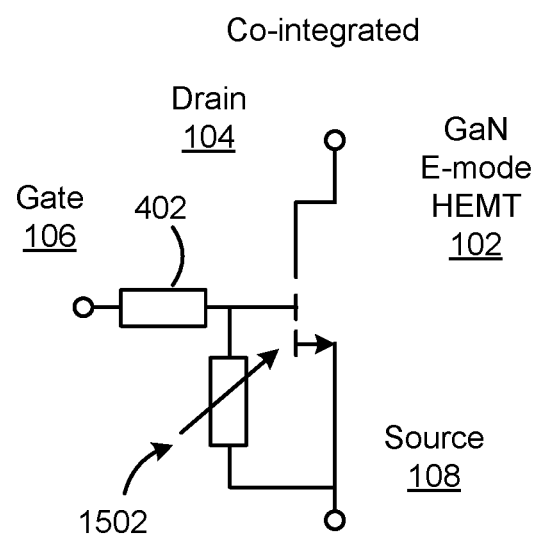
FIG. 15 is a circuit diagram of an alternate implementation of the circuits of FIGS. 1, 4, and 6.

In FIG. 15, a variable gate-source resistor 1502 is illustrated as being connected to the source 108 after the gate resistor 402, as shown. As a result, the variable gate-source resistor 1502 may be understood to correspond to the variable resistor R1' 910 of FIG. 9.

Figure 16A:
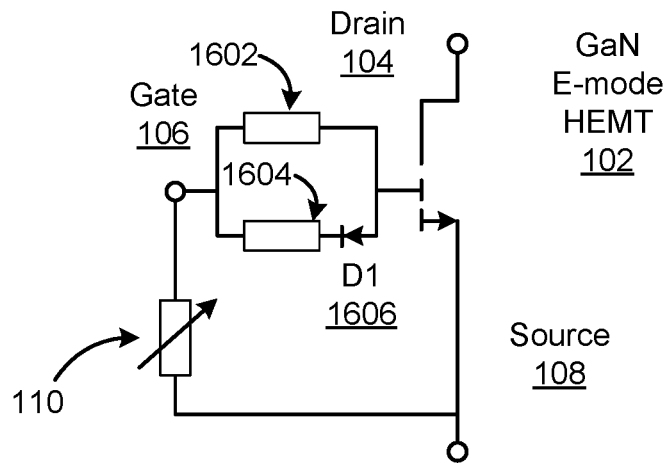
FIG. 16A is a circuit diagram of an alternate implementation of the circuits of FIGS. 1, 4, and 6.
Figure 16B:
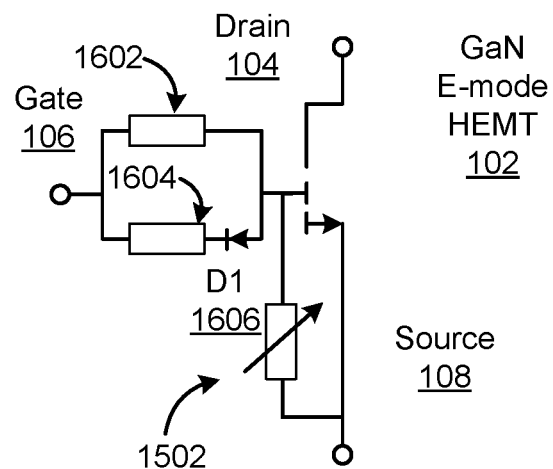
FIG. 16B is a circuit diagram of an alternate implementation of the circuit of FIG. 16A.

In FIG. 16A, a gate resistor 1602 is shown as being connected in parallel with a series connection of a gate resistor 1604 and a diode 1606. FIG. 16B illustrates that the configuration of the variable gate-source resistor 1502 and/or the variable gate source resistor 1502 may be used. The configurations of FIGS. 16A and 16B may be used to provide different switching speed for turn-off and turn-on.

Figure 17:
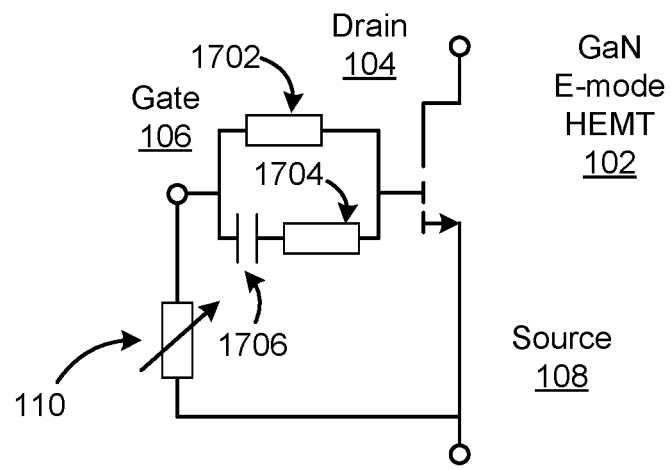
FIG. 17 is a circuit diagram of an alternate implementation of the circuits of FIGS. 1, 4, and 6.

In FIG. 17, a gate resistor 1702 is shown as being connected in parallel with a series connection of a gate resistor 1704 and a capacitor 1706. This configuration of FIG. 17 may be used to provide an enhanced voltage for turn off and turn on.

Figure 18:
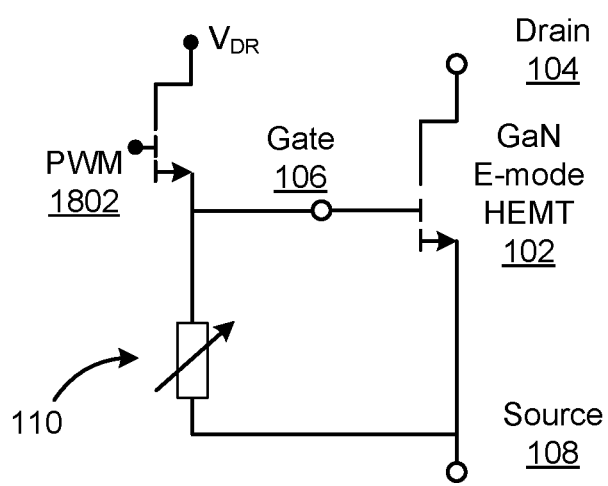
FIG. 18 is a circuit diagram of an alternate implementation of the circuits of FIGS. 1, 4, and 6.

In FIG. 18, a pre-driver circuit 1802 is shown as being co-integrated with the GaN transistor 102 and the variable gate-source resistor 102. Such a configuration may be instrumental in, e.g., reducing a common source inductance for a gate loop of the GaN transistor 102, which may further reduce the unwanted gate-source oscillations.

Thus, in accordance with the above description, various types of transistors, including, e.g., a pGaN, DHEMT or MISHEMT (metal insulator semiconductor HEMT) GaN transistor, may be provided with one or more gate-to-source, co-integrated variable resistor(s), which may be made on a 2DEG (2-dimensional electron gas) segment contacted by two conductive electrodes at the edges, and that is relatively short (e.g., less than about 2 microns). The variable resistor(s) exhibits a resistance value that is increasing with the applied Vgs (e.g., up to +6V), and decreasing with the Vgs oscillation frequency (e.g., in the range of hundreds of MHz).

One or more additional resistor(s) (which may be constant or variable) may be made between a gate and the variable resistor(s). Such an additional resistor(s) may be made on a relatively long 2DEG segment (e.g., greater than about 6 um) or in a gate metal track.

The various implementations may be combined with various gating schemes. For example, such gating schemes may include an asymmetric gating scheme before or after the connection of the variable resistor(s) with the gate of the main GaN transistor, or a capacitive gating scheme before or after the connection of the variable resistor with the gate of the main GaN transistor, or several of the various resistors connected in series, as described and illustrated above.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor transistor device, comprising:
   a GaN transistor including a drain, a gate, and a source, the GaN transistor having a driving voltage applied across the gate and the source and configured to switch between an on-voltage associated with an on-state of the GaN transistor and an off-voltage associated with an off-state of the GaN transistor, wherein the driving voltage oscillates in response to a transition between the on-state and the off-state, and the driving voltage oscillations have a resonance frequency higher than a switching frequency of the driving voltage; and
   a variable gate-source resistor connected between the gate and the source and having a variable resistance that varies in response to changes in the driving voltage when switching between the on-state and the off-state of the GaN transistor,
   wherein the variable gate-source resistor includes a resistive dielectric region with a resistivity that varies directly with the driving voltage of the GaN transistor and indirectly with a driving frequency of the driving voltage.

2. The semiconductor transistor device of claim 1, wherein the variable resistance varies directly with a magnitude of the driving voltage within a switching frequency range of the switching.

3. The semiconductor transistor device of claim 2, wherein the variable resistance varies within a range corresponding to a driving voltage range between the on-voltage and the off-voltage.

4. The semiconductor transistor device of claim 1, wherein the driving voltage switches at a switching frequency, and oscillates in response to a transition between the on-state and the off-state with a resonance frequency higher than the switching frequency, and further wherein the variable gate-source resistor is configured to filter the driving voltage within the resonance frequency.

5. The semiconductor transistor device of claim 1, further comprising a gate resistor connected at the gate of the GaN transistor.

6. The semiconductor transistor device of claim 5, wherein a resistance value of the gate resistor varies directly with a driving frequency of the driving voltage.

7. The semiconductor transistor device of claim 1, wherein the variable gate-source resistor is configured to maintain the driving voltage oscillations relative to a threshold voltage of the GaN transistor to prevent turn-off of the GaN transistor during the on-state, or turn-on of the GaN transistor during the off-state.

8. A semiconductor transistor device, comprising:
   a GaN transistor including a drain, a gate, and a source, the GaN transistor having a driving voltage applied across the gate and the source that switches between an on-voltage associated with an on-state of the GaN transistor and an off-voltage associated with an off-state of the GaN transistor, wherein the driving voltage oscillates in response to a transition between the on-state and the off-state, the driving voltage oscillations have a resonance frequency higher than a switching frequency of the driving voltage; and a variable gate-source resistor connected between the gate and the source, the variable gate-source resistor including a resistive dielectric region with a resistivity that varies directly with the driving voltage of the GaN transistor and indirectly with a driving frequency of the driving voltage and thereby provides a low-pass filter that filters the driving voltage oscillations at the resonance frequency and during a transition between the off-state and the on-state.

9. The semiconductor transistor device of claim 8, wherein a resistance value of the variable gate-source resistor is matched to a driving voltage range of the driving voltage, and reaches a maximum value at the on-voltage and a minimum value at the off-voltage.

10. The semiconductor transistor device of claim 8, wherein the variable gate-source resistor is configured to pull the driving voltage oscillations to the off-voltage following a transition between the on-state and the off-state.

11. The semiconductor transistor device of claim 8, further comprising a gate resistor connected at the gate of the GaN transistor.

12. The semiconductor transistor device of claim 11, wherein a resistance of the gate resistor varies directly with a driving frequency of a driving voltage of the GaN transistor.

13. A semiconductor transistor device, comprising:
a GaN transistor including a drain, a gate, and a source, the GaN transistor having a driving voltage applied across the gate and the source and configured to switch with a switching frequency between an on-voltage associated with an on-state of the GaN transistor and an off-voltage associated with an off-state of the GaN transistor, the driving voltage oscillating in response to a transition between the on-state and the off-state, the driving voltage oscillations having a resonance frequency higher than the switching frequency; and a variable gate-source resistor connected between the gate and the source, the variable gate-source resistor including a resistive dielectric region with a resistivity that varies indirectly with a driving frequency of the driving voltage and thereby provide a low-pass filter that filters the driving voltage oscillations at the resonance frequency.

14. The semiconductor transistor device of claim 13, wherein the variable gate-source resistor has a resistance value that varies directly with the driving voltage.

15. The semiconductor transistor device of claim 13, wherein the variable gate-source resistor is configured to maintain the driving voltage oscillations relative to a threshold voltage of the GaN transistor to prevent turn-off of the GaN transistor during the on-state, or turn-on of the GaN transistor during the off-state.

* * * * *